United States Patent
Chen et al.

(10) Patent No.: US 6,268,751 B1
(45) Date of Patent: Jul. 31, 2001

(54) DUTY CYCLE OPTIMIZED PRESCALER

(75) Inventors: Qinghua Chen, Campbell, CA (US); Khodor Elnashar, Dallas, TX (US); Kishore Mishra, Folsom, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/454,933

(22) Filed: Dec. 3, 1999

Related U.S. Application Data

(60) Provisional application No. 60/112,443, filed on Dec. 16, 1998.

(51) Int. Cl.[7] .................. H03K 3/017; H03K 5/04; H03K 7/08
(52) U.S. Cl. .................................. 327/175; 327/299
(58) Field of Search ..................... 327/172, 174, 327/175, 176, 299

(56) References Cited

U.S. PATENT DOCUMENTS 5,250,939 * 10/1993 Takanashi et al. .................... 345/204
5,963,885 * 10/1999 Macq ..................................... 702/52

* cited by examiner

*Primary Examiner*—Terry D. Cunningham
*Assistant Examiner*—Quan Tra
(74) *Attorney, Agent, or Firm*—Mark E. Courtney; W. James Brady; Frederick J. Telecky, Jr.

(57) ABSTRACT

A Duty cycle optimized prescaler (10) optimizes the clock duty cycle as close as possible to fifty percent. This is achieved by employing two count by two counters (11,12), one (12) to count negative edges of the clock pulse, and one (11) to count positive edges of the clock pulse. Each counter (11,12) output is connected to a comparator (14,15) which compares each counter output (11,12) to a prescaler setting (13). The comparators (14,15) outputs are input to an OR gate (16), the output of which, when, a logic 1, resets the counters (11,12) and toggles a flip-flop circuit (17) providing a clock output signal.

5 Claims, 3 Drawing Sheets

DUTY CYCLE OPTIMIZED PRESCALER

This application claims priority under 35 USC § 119 (e) (1) of Provisional Application Number 60/112,443, filed Dec. 16, 1998.

FIELD OF THE INVENTION

The invention relates to duty cycle clocks, and more particularly to a duty cycle optimized prescaler used in integrated circuits to optimize the duty cycle of a clock to fifty percent.

BACKGROUND OF THE INVENTION

Prescaler circuits generate an output signal that is a fractional scale factor related to the input signal. The output signal is synchronous and proportional in frequency to a clock signal. Some circuits provide an unbalanced duty cycle which is at a fixed rate. A clock signal output of a duty cycle unbalanced prescaler is fixed, for example, to:

(1). 1 cycles low and N/2 cycles high, when the prescaler value N is an even number and 1<N>15.

(2). 1.5 cycle low and N/2–1.5 cycles high, when prescaler value N is an odd number and 2<N<16.

(3). 4 cycle low and N/2–4 cycles high, when prescaler value N is an even number and 15>N>63.

(4). 4.5 cycle low and N/2–4.5 cycles high, when prescaler value is an odd number and 16<N<64.

This scheme results in a duty cycle unbalanced clock. This causes problems in high frequency designs because of the narrow clock pulse. This design is technology dependent.

Alternate solutions have been used using digital phase lock loop (DPLL) which can yield a 50% duty cycle most of the time. The main draw-back is that this approach requires more silicon space on an integrated circuit chip, and thus more power.

A 50% duty cycle divide-by-N counter is described in U.S. Pat. No. 5,127,036. The described circuit generates a duty cycle output clock signal having a fifty percent duty cycle.

U.S. Pat. No. 5,491,440, describes a circuit for automatically adjusting the duty cycle of an output clock. The circuit utilizes a D-type flip-flop and requires an input of a referenced voltage, a reset signal, and input clock signal.

SUMMARY OF THE INVENTION

The invention is a logic synthesizable RTL implementation of a programable baud rate generator used in integrated circuits. The invention can be implemented in hardware description language (HDL) such as verilog or VHDL and then synthesized using actual gate implementation. This allows the invention to be portable from one design to another design that is technology independent.

The invention solves the problem of an unbalanced duty cycle clock used in an integrated circuit. In order to prevent this unbalance, the present invention optimizes the clock duty cycle as close as possible to fifty percent. This is achieved by employing two counters: one to count negative edges of the clock pulse, and one to count positive edges of the clock pulse. Each counter output is connected to a comparator which compares each counter output to a prescaler setting. The comparator outputs are input to an OR gate, the output of which, when a logic 1, resets the counters and toggles a flip-flop circuit providing a clock output signal.

DESCRIPTION OF A PREFERRED EMBODIMENT

Figure 1:
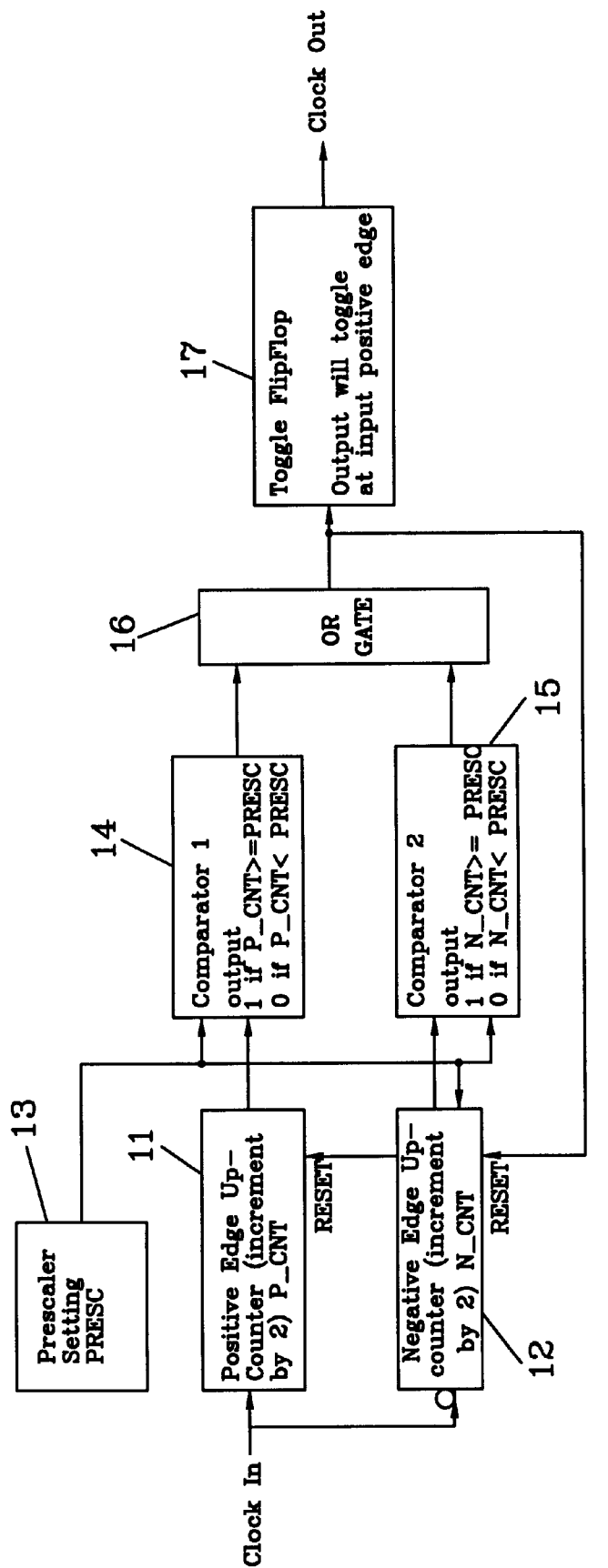
FIG. 1 shows a block diagram of a duty cycle optimized prescaler.

The invention solves the problem of an unbalanced duty cycle clock used in an integrated circuit. In order to prevent this unbalance, the present invention optimizes the clock duty cycle as close as possible to fifty percent. This is achieved by employing two counters: one to count negative edges of the clock pulse, and one to count positive edges of the clock pulse. FIG. 1 shows a block diagram of the duty cycle optimizer prescaler 10. Positive edge counter (P_CNT) 11 increases by two for every positive transient of the input clock. This is indicated in counter 11 by the inscription "Positive Edge up-counter (increment by 2). Counter 11 is reset to zero upon the RESET signal going high.

Counter 12 (N_CNT) is a negative edge up-counter. Counter 12 (N_CNT) increases by two at every negative transient of the input clock (CLOCK IN) if the least significant bit (LSB) of the prescaler setting value PRESC is logic 1. In the examples given below, the Prescaler value PRESC is set to a value 7 (digital 111). In this instantance the LSB is a 1. In the second example, the value of PRESC is 6 (digital 110). In this example the LSB is 0. Counter 12 is reset to zero upon RESET going high.

The P_CNT value from counter 11 is applied to comparator 14 and is compared with the prescaler setting value PRESC from Prescaler 13. The output from comparator 14 will be logic 1 if P_CNT counter value is greater than or equal to the setting of PRESC. Otherwise, the output of comparator 14 will be logic 0.

Comparator 15 is used to compare the value N_CNT with the prescaler 13 setting PRESC. The output from comparator 15 will be logic 1 if N_CNT counter value is greater than or equal to the setting of PRESC. Other wise, the output of comparator 14 will be logic 0.

OR gate 16 is used to perform an OR operation on the two comparators (comparators 14 and 15) outputs. OR gate 16 output will be logic 1 if either of the outputs of comparator 14 and comparator 15 is logic 1. The output of OR gate 16 is used to reset counters 11 and 12 (P_CNT and N_CNT). The output of OR gate 16 is also used to toggle the clock output using flip flop 17. Flip Flop 17 toggles the Clock-Out when OR gate 16 output changes from logic 0 to logic 1. This occurs with the positive edge of OR gate 16 output.

Figure 2:
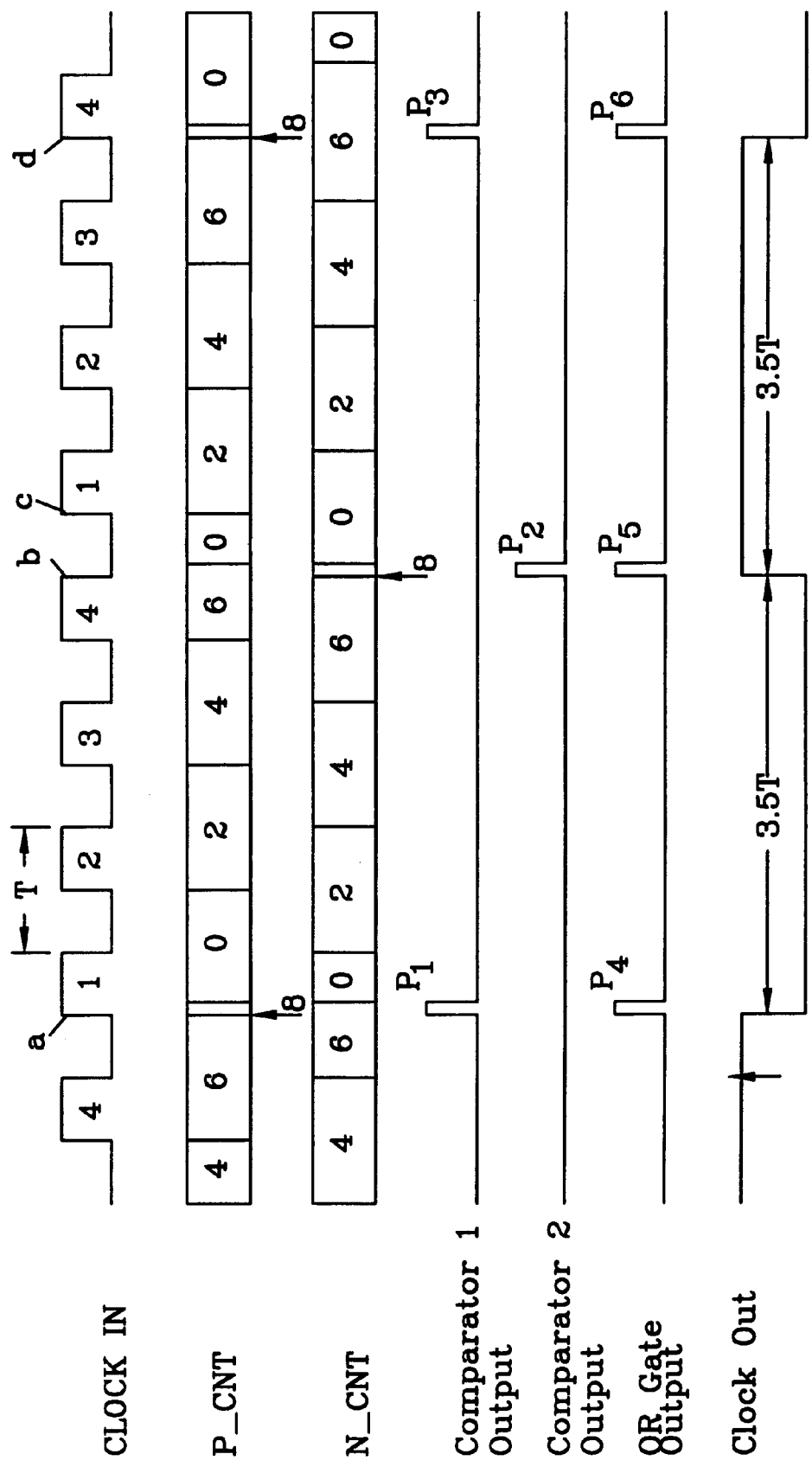
FIG. 2 shows prescaler setting to a clock output of 7.

FIG. 2 shows a timing diagram when the Prescaler 13 is set to the odd number 7. In this example, the LSB is a 1. P_CNT, the count of Comparator 1(14) shows, in FIG. 2, a beginning count of 4. With the positive edge of CLOCK IN of pulse 4, the count P_CNT changes to 6. With the positive edge a of pulse 1, P_CNT changes to 8. Since 8 is >7, Comparator 1 has an output $P_1$ of 1 when P_CNT>= PRESC. At this point, the OR GATE 16 output $P_4$ will also be one. This starts a new Clock Out cycle. Both $P_{13}$ CNT and N_CNT are reset to 0.

With the resetting of P_CNT and N_CNT to 0, a new count begins. P_CNT counts will be 0, 2, 4 and 6. N_CNT will also be 0, 2, 4 and 6. Since the negative edge b of clock pulse 4 (second count) occurs before the next positive edge c, then the output of Comparator 2 will be a positive pulse $P_2$, and OR Gate 16 output will be a positive pulse $P_5$, resetting Comparators 1 and 2. The pulse $P_2$ occurs because the LSB of PRESEC is 1.

The count starts over at point c, so that both Comparator 1 and Comparator 2 will count up to 6, then at the positive edge d of count 4 (third count 4), P_CNT again exceeds 7 and output of Comparator 1 will be a positive pulse $P_3$ resetting both Comparator 1 and Comparator 2 to 0 by the Positive pulse $P_6$ from OR Gate 16.

Figure 3:
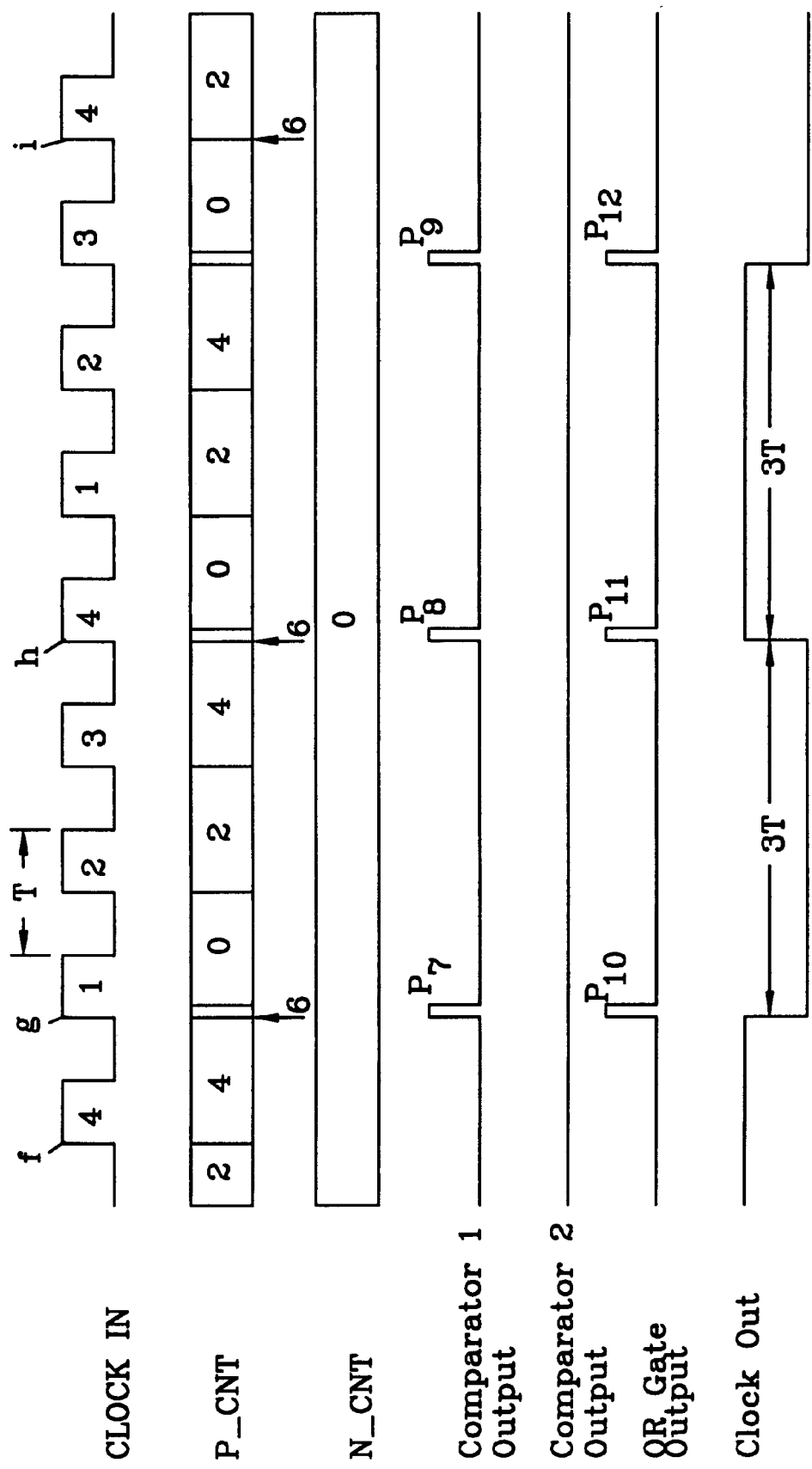
FIG. 3 shows prescaler setting to a clock output of 6.

FIG. 3 shows a timing diagram for a PRESC setting of 6. P_CNT is shown beginning, in this FIG., at 2. N_CNT is 0. A positive clock edge f will change the count in Comparator 1 to 4 and the next positive edge g of the Clock Pulse will set the count to 6. With PRESC set to 6, then Comparator 1 will output a positive pulse $P_7$ and OR Gate 16 will output a positive pulse $P_{10}$. Pulse $P_{10}$ will reset both Comparator 1 and Comparator 2 counts to 0. This starts a new cycle. In each of the cycles, if N_CNT reaches a count before P_CNT reaches a count of 6, there is no change since the LSB of PRESEC is 0. This prevents N_CNT from causing an output from Comparator 2. Only comparator 1 will output positive pulses, i.e. pluses $P_7$, $P_8$ and $P_9$. Or Gate 16 will output pulses $P_{10}$, $P_{11}$ and $P_{12}$, corresponding to $P_7$, $P_8$ and $P_9$, respectively.

As a result of the configuration and programming of the duty cycle otimized prescaler circuit of FIG. 1, when PRESEC is an even number (LSB=0), the prescaler 13 will always yield a 50% duty cycle. When PRESC is an odd number (LSB=1), the prsecaler output will have an optimal duty cycle closest to 50%.

What is claimed is:

1. A duty cycle optimized prescaler circuit, comprising:

a first counter incremented by a positive clock pulse input;

a second counter incremented by a negative clock pulse input;

a prescaler having a preset value;

a first comparator for receiving the prescaler value and the output of the first counter;

A second comparator for receiving the prescaler value and the output of the second counter;

an OR gate for receiving the outputs of the first and second comparator;

a toggle flip-flop for providing a clock output when a logic one is supplied to the OR gate by either of the comparators.

2. The duty cycle optimized prescaler circuit according to claim 1, wherein a positive pulse is output to the Or gate when either of first and second comparators count to a value >= than the prescaler preset value.

3. The duty cycle optimized prescaler circuit according to claim 1, wherein said second counter is increased by two at every negative transient of the input clock when the least significant bit (LSB) of the prescaler setting is logic 1.

4. The duty cycle optimized prescaler circuit according to claim 1, wherein said second counter is not increase by two at every negative transient of the input clock when the least significant bit (LSB) of the prescaler setting is logic 0.

5. The duty cycle optimized prescaler circuit according to claim 1, wherein said first counter is increased by two at every positive transient of the input clock.

* * * * *